US008620006B2

(12) United States Patent
Berardi et al.

(10) Patent No.: US 8,620,006 B2
(45) Date of Patent: Dec. 31, 2013

(54) CENTER CHANNEL RENDERING

(75) Inventors: William Berardi, Grafton, MA (US); Hilmar Lehnert, Framingham, MA (US); Guy Torio, Ashland, MA (US)

(73) Assignee: Bose Corporation, Framingham, MA (US)

( * ) Notice: Subject to any disclaimer, the term of this patent is extended or adjusted under 35 U.S.C. 154(b) by 857 days.

(21) Appl. No.: 12/465,146

(22) Filed: May 13, 2009

(65) Prior Publication Data

US 2010/0290630 A1 Nov. 18, 2010

(51) Int. Cl.
*H03G 5/00* (2006.01)

(52) U.S. Cl.
USPC .................................... 381/99; 381/1; 381/2

(58) Field of Classification Search
USPC .................................................. 381/99, 1, 2
See application file for complete search history.

(56) References Cited

U.S. PATENT DOCUMENTS 4,792,974 A * 12/1988 Chace ............................. 381/1
5,197,100 A 3/1993 Shiraki
2006/0222182 A1 10/2006 Nakaishi et al.
2007/0147623 A1 6/2007 Kim et al.
2007/0286427 A1 12/2007 Jung et al.

FOREIGN PATENT DOCUMENTS

EP 1021063 A2 7/2000
EP 1427253 A2 6/2004
EP 1455554 A2 9/2004
JP 9037384 A 2/1997

OTHER PUBLICATIONS

International Search Report and Written Opinion dated Aug. 9, 2010 for PCT/US2010/034310.

Silva, Robert, Surround Sound—What You Need to Know, The History and Basics of Surround Sound, About.com, http://hometheater.about.com/od/beforeyoubuy/a/surroundsound.htm, taken from the Internet May 13, 2009.

Linkwitz, Siegfried H., Linkwitz Lab, Accurate Reproduction and Recording of Auditory Scenes, surround Sound, http://www.linkwitzlab.com/surround_system.htm, taken from the Internet May 13, 2009.

Rubinson, Kalman, Music in the Round #4, http://www.stereophile.com/musicintheround/304round/, taken from the Internet May 13, 2009.

Moulton, Dave, The Center Channel: Unique and Difficult, TV Technology the Digital Television Authority, http://www.tvtechnology.com/article/11798, taken from the Internet May 13, 2009.

* cited by examiner

*Primary Examiner* — Samuel Gebremariam
(74) *Attorney, Agent, or Firm* — Bose Corporation

(57) ABSTRACT

An audio system including a rendering processor for separately rendering a dialogue channel and a center music channel. The audio system may include circuitry for extracting one or both of the dialogue channel or the center music channel from program material that does not include both a dialogue channel and a center music channel. The dialogue channel and the center music channel may be radiated with different radiation patterns.

16 Claims, 9 Drawing Sheets

CENTER CHANNEL RENDERING

BACKGROUND

This specification describes a multi-channel audio system having a so-called "center channel."

SUMMARY OF THE INVENTION

In one aspect, an audio system includes a rendering processor for separately rendering a dialogue channel and a center music channel. The audio system may further include a channel extractor for extracting at least one of the dialogue channel and the center music channel from program material that does not include both of the dialogue channel and the center music channel. The channel extractor may include circuitry for extracting a dialogue channel and a center music channel from program material that does not include either of a dialogue channel and a center music channel. The rendering processor may further include circuitry for processing the dialogue channel audio signal and the center music channel audio signal so that the center dialogue channel and the center music channel are radiated with different radiation patterns by a directional array. The dialogue channel and the center music channel may be radiated by the same directional array. The dialogue channel and the center music channel may be radiated by different elements of the same directional array. The internal angle of directions with sound pressure levels within −6 dB of the highest sound pressure level in any direction may be less than 120 degrees in a frequency range for the dialogue channel radiation pattern, and the internal angle of directions with sound pressure levels within −6 dB of the highest sound pressure level in any direction may be greater than 120 degrees in at least a portion of the frequency range for the center music channel radiation pattern. The difference between the maximum sound pressure level in any direction in a frequency range and the minimum sound pressure level in any direction in the frequency range may be greater than −6 dB for the dialogue channel radiation pattern and between 0 dB and −6 dB for the center music channel radiation pattern. The rendering processor may render the dialogue channel and the center music channel to different speakers. The rendering processor may combine the center music channel with a left channel or a right channel or both.

In another aspect, an audio signal processing system includes a discrete center channel input and signal processing circuitry to create a center music channel. The signal processing circuitry may include circuitry to process channels other than the discrete center channel to create the center music channel. The signal processing circuitry may include circuitry to process the discrete center channel and other audio channels to create the center music channel. The audio signal processing system may further include circuitry to provide the discrete center channel to a first speaker and the center music channel to a second speaker.

In another aspect, an audio processing system includes a channel extractor for extracting at least one of the dialogue channel and the center music channel from program material that does not include both of the dialogue channel and the center music channel. The channel extractor may include circuitry for extracting a dialogue channel and a center music channel from program material that does not include either of a dialogue channel and a center music channel.

DETAILED DESCRIPTION

Figure 1:
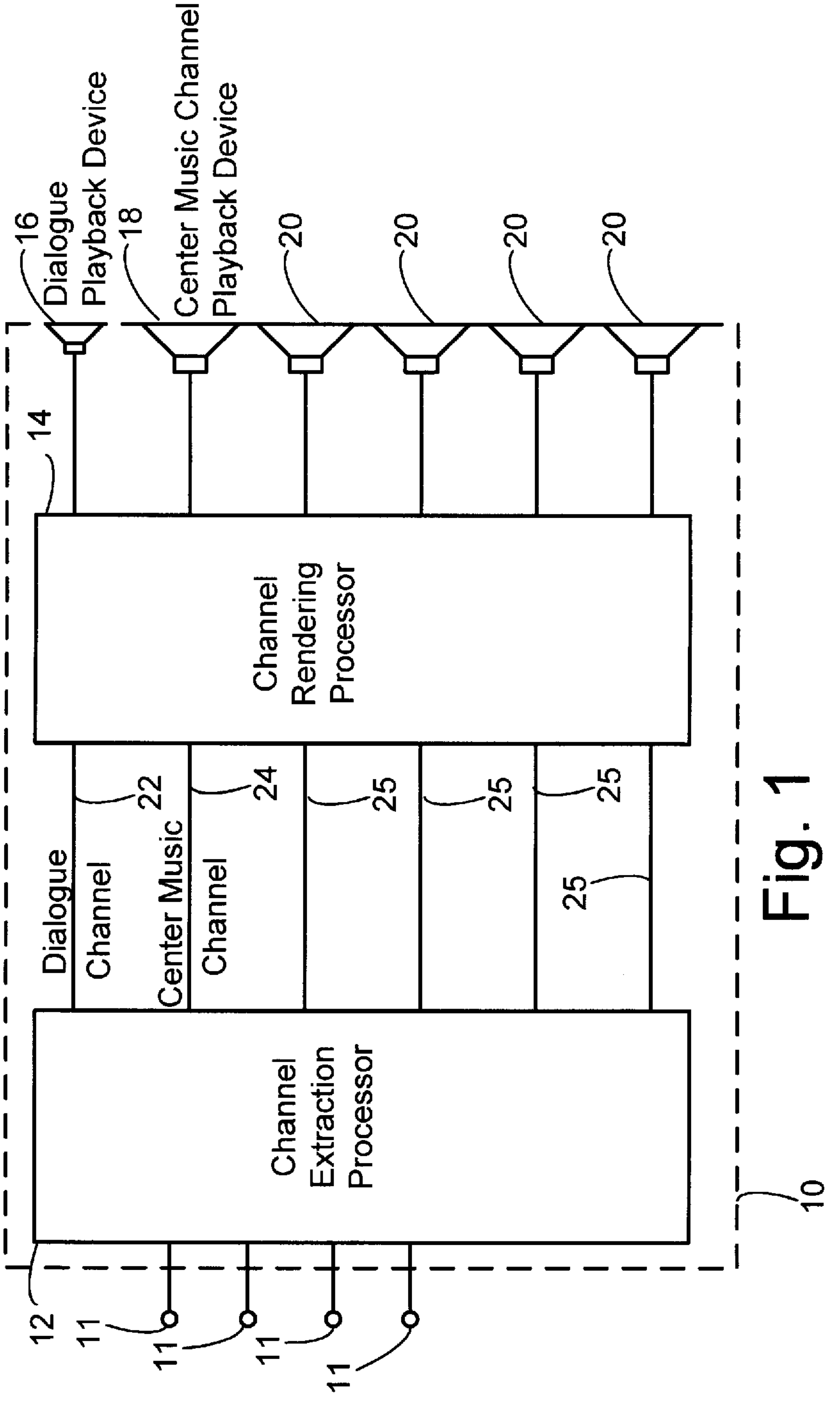
FIG. 1 is a block diagram of an audio system.

Though the elements of several views of the drawing are shown and described as discrete elements in a block diagram and are referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Unless otherwise indicated, signal lines may be implemented as discrete analog or digital signal lines, as a single discrete digital signal line with appropriate signal processing to process separate streams of audio signals, or as elements of a wireless communication system. Unless otherwise indicated, audio signals may be encoded in either digital or analog form. For convenience, "radiating sound waves corresponding to channel x" will be expressed as "radiating channel x." A "speaker" or "playback device" is not limited to a device with a single acoustic driver. A speaker or playback device can include more than one acoustic driver and can include some or all of a plurality of acoustic drivers in a common enclosure, if provided with appropriate signal processing. Different combinations of acoustic drivers in a common enclosure can constitute different speakers or playback devices, if provided with appropriate signal processing.

Many multi-channel audio systems can process or play back a center channel. The center channel may be a discrete channel present in the source material or may be extracted from other channels (such as left and right channels).

The desired acoustic image of a center channel may vary depending on the content of the center channel. For example, if the program content includes spoken dialogue whose intended apparent source is on a screen or monitor it is usually desired that the acoustic image be "tight" and unambiguously on-screen. If the program content is music it is usually desired that the apparent source is more vague and diffuse.

A tight, on-screen image is typically associated with spoken dialogue (typically a motion picture or video reproduction of a motion picture). For that reason, a center channel associated with a tight, on-screen image will be referred to herein as a "dialogue channel", it being understood that a dialogue channel may include non-dialogue elements and that in some instances dialogue may be present in other channels (for example if the intended apparent source is off-screen) and further understood that there may be instances when a more diffuse center image is desired (for example, a voice-over).

A more diffuse acoustic image is usually associated with music, especially instrumental or orchestral music. For that reason, a center channel associated with a diffuse image will be referred to herein as a "center music channel", it being understood that a music channel may include dialogue and it being further understood that there may be instances in which a tighter, on-screen acoustic image for music audio is desired.

Dialogue channels and center music channels may also vary in frequency content. The frequency content of a dialogue channel is typically in the speech spectral band (for example, 150 Hz to 5 kHz), while the frequency content of a center music channel may range in a wider spectral band (for example 50 Hz to 9 kHz).

If the source material does not have a center channel (either dialogue or music), but the rendering or playback system does have the capability of radiating a center channel, the rendering or playback system may extract a center channel from the source audio signals. The extraction may be done by a number of methods. In one method, the speech content is extracted so that the center channel is a dialogue channel, and played back through a center channel playback device. One simple method of extracting a speech channel is to use a band pass filter to extract the spectral portion of the input signal that is in the speech band. Other more complex methods may include analyzing the correlation between the input channels or detecting patterns characteristic of speech. In another method for extracting a center channel, the content of at least two directional channels is processed to form a new directional channel. For example a left front channel and a right front channel may be processed to form a new left front channel, a new right front channel, and a center front channel.

Processing a dialogue channel as a center music channel or vice versa can have undesirable results. If a dialogue channel is processed as a center music channel, the acoustic image may appear diffuse rather than the desired tight on-screen image and the words may be less intelligible than desired. If a center music channel processed as a dialogue channel, the acoustic image may appear more narrow and direct than desired, and the frequency response may be undesirable.

Referring to FIG. 1, there is shown an audio system 10. The audio system includes multiple input channels 11 (represented by lines), to receive audio signals from audio signal sources. The audio system may include a channel extraction processor 12 and a channel rendering processor 14. The audio system further includes a number of playback devices, which may include a dialogue playback device 16, a center music channel playback device 18, and other playback devices 20.

In operation, the channel extraction processor 12 extracts, from the input channels 11, additional channels that may be not be included in the input channels, as will be explained in more detail below. The additional channels may include a dialogue channel 22, a center music channel 24, and other channels 25. The channel rendering processor 14 prepares the audio signals in the audio channels for reproduction by the playback devices 16, 18, 20. Processing done by the rendering processor 14 may include amplification, equalization, and other audio signal processing, such as spatial enhancement processing.

In FIG. 1 and subsequent figures, channels are represented by discrete lines. In an actual implementation, multiple input channels may be input through a single input terminal or transmitted through a single signal path, with signal processing appropriate to separate the multiple input channels from a single input signal stream. Similarly, the channels represented by lines 22, 24, and 25 may be a single stream of audio signals with appropriate signal processing to process the multiple input channels separately. Many audio systems have a separate bass or low frequency effects (LFE) channel, which may include the combined bass portions of multiple channels and which may be radiated by a separate low frequency speaker, such as a woofer or subwoofer. The audio system 10 may have a low frequency or LFE channel and may also have a woofer or subwoofer speaker, but for convenience, they are not shown in this view. Playback devices 16, 18, 20 can be conventional loudspeakers or may be some other type of device such as a directional array, as will be described below. The playback devices may be discrete and separate as shown, or may have some or all elements in common, such as directional arrays 40CD of FIG. 9 or directional array 42 of FIG. 10.

The channel extraction processor 14 and the channel rendering processor may comprise discrete analog or digital circuit elements, but is most effectively done by a digital signal processor (DSP) executing signal processing operations on digitally encoded audio signals.

Figure 2:
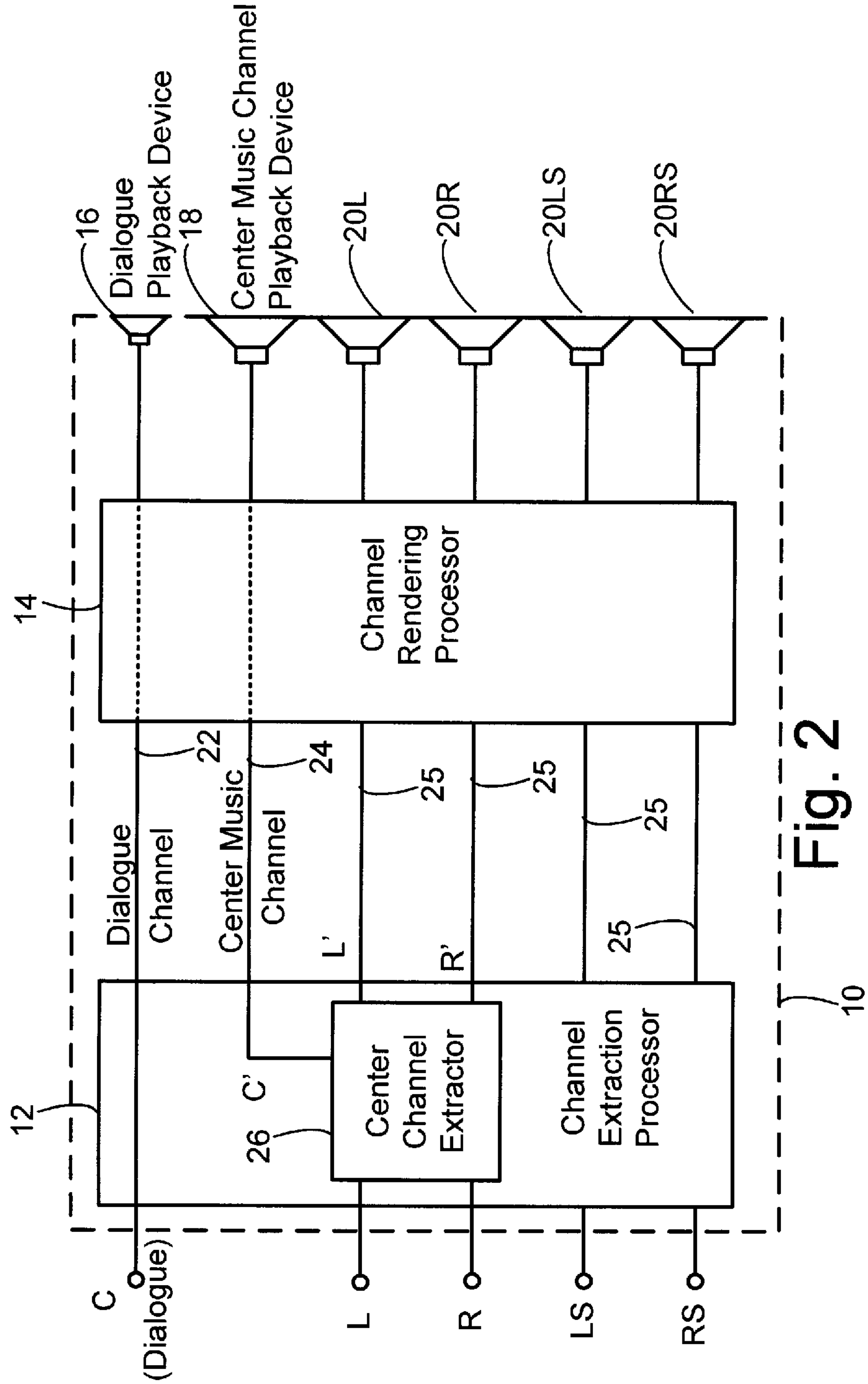
FIG. 2 is a block diagram of an audio system including a center channel extractor.

FIG. 2 shows an audio system with the channel extraction processor 12 in more detail, specifically with a center channel extractor 26 shown. In the system of FIG. 2, there are five input channels; a center dialogue channel C, a left channel L, a right channel R, a left surround channel LS, and a right surround channel RS. The terminals for the L channel and the R channel are coupled to the center channel extractor 26, which is coupled to the center music channel playback device 18 through the channel rendering processor 14, and to the L channel playback device 20L, and the R channel playback device 20R. In this and subsequent figures, the prime (') designator indicates the output of the channel extraction processor 14. The content of the extractor produced channels may be substantially the same or may be different than the content of the corresponding input channels. For example, the content of the channel extractor produced left channel L' may differ from the content of left input channel L.

In operation, the center channel extractor 26 processes the L and R input channels to provide a center music channel C', and left and right channels (L' and R'). The center music channel is then radiated by the center music channel playback device 18.

The center music channel extractor 26 is typically a DSP executing signal processing operations on digitally encoded audio signals. Methods of extracting the center music channel are described in U.S. patent Published App. 2005/0271215 or U.S. Pat. No. 7,016,501, incorporated herein by reference in their entirety.

Figure 3:
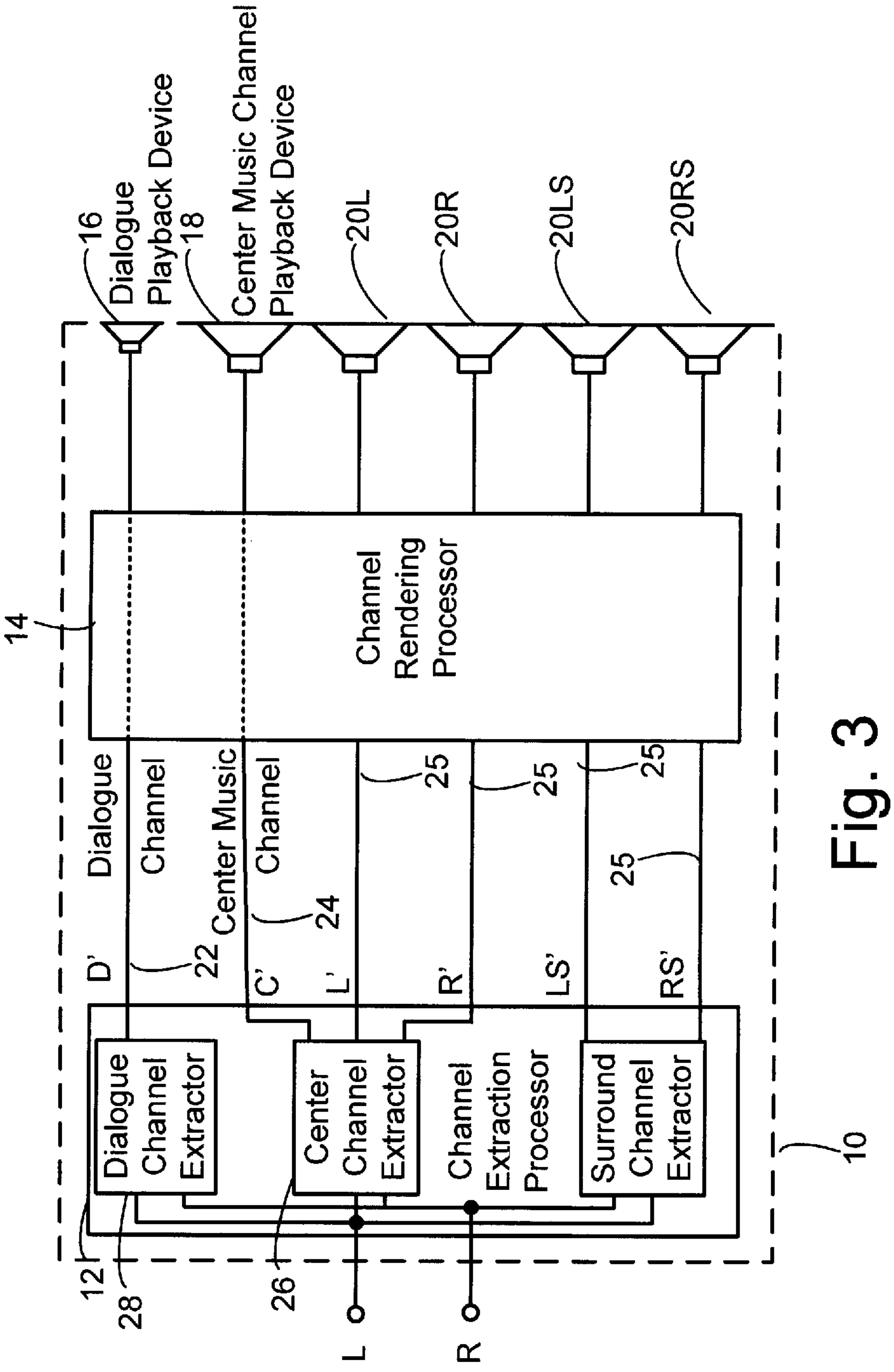
FIG. 3 is a block diagram of an audio system including a center music channel extractor and a dialogue channel extractor.

In the audio system of FIG. 3, the source material only has two input channels, L and R. Coupled to input channels L and R are center channel extractor 26 of FIG. 2 (coupled to center music channel playback device 18, to left playback device 20L, and to right playback device 20R by channel rendering processor 14), a dialogue channel extractor 28 (coupled to dialogue playback device 16), and a surround channel extractor 30 (coupled to surround playback devices 20LS and 20RS by rendering processor 14).

In operation, the center channel extractor 26 processes the L and R input channels to provide a center music channel C', and left and right channels. The channel extractor-produced left and right channels (L' and R') may be different than the L and R input channels, as indicated by the prime (') indicator. The center music channel is then radiated by the center music channel playback device 18. The dialogue channel extractor 28 processes the L and R channels to provide a dialogue channel D', which is then radiated by dialogue playback device 16. The surround channel extractor 30 processes the L and R channels to provide left and right surround channels LS and RS, which are then radiated by surround playback devices 20LS and 20RS, respectively.

The center music channel extractor 26, dialogue channel extractor 28, and the surround channel extractor 30 are typically DSPs executing signal processing operations on digitally encoded audio signals. A method of extracting a center music channel is described in U.S. Pat. No. 7,016,501. A method of extracting the dialogue channel is described in U.S. Pat. No. 6,928,169. Methods of extracting the surround channels are described in U.S. Pat. Nos. 6,928,169, 7,016,501, or U.S. patent App. 2005/0271215, incorporated by reference herein in their entirety. Another method of extracting surround channels is the ProLogic® system of Dolby Laboratories, Inc. of San Francisco, Calif., USA.

Figure 4:
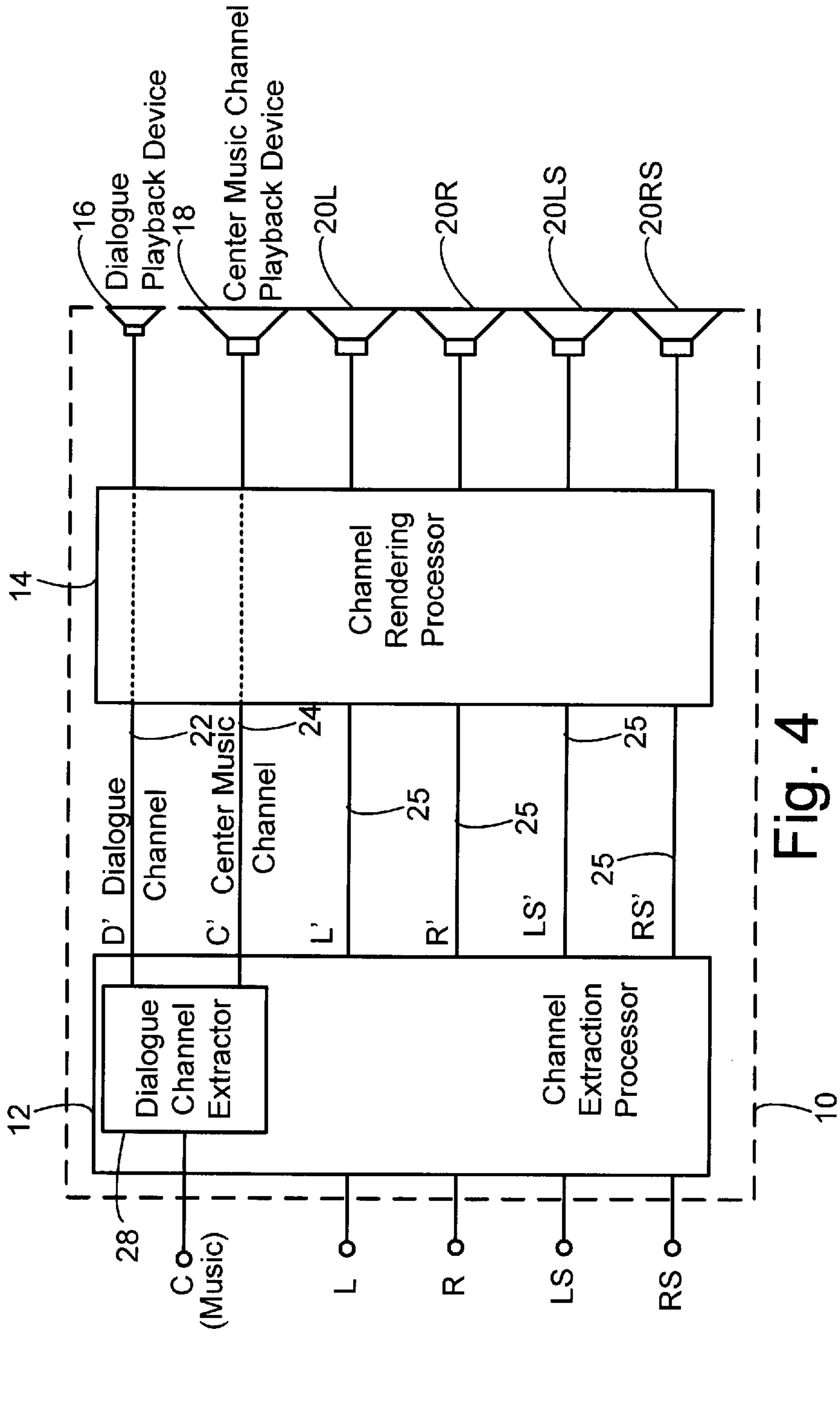
FIG. 4 is a block diagram of an audio system including a dialogue channel extractor.

The audio system of FIG. 4 has a center music input channel C but no dialogue channel. The dialogue channel extractor 28 is coupled to the C channel input terminal and to the dialogue playback device 16 and to the center music channel playback device 18 through the channel rendering processor 14.

In operation, the dialogue channel extractor 28 extracts a dialogue channel D' from the center music channel and other channels, if appropriate. The dialogue channel is then radiated by a dialogue playback device 16. In other embodiments, the input to the center channel extractor may also include other input channels, such as the L and R channels.

Figure 5:
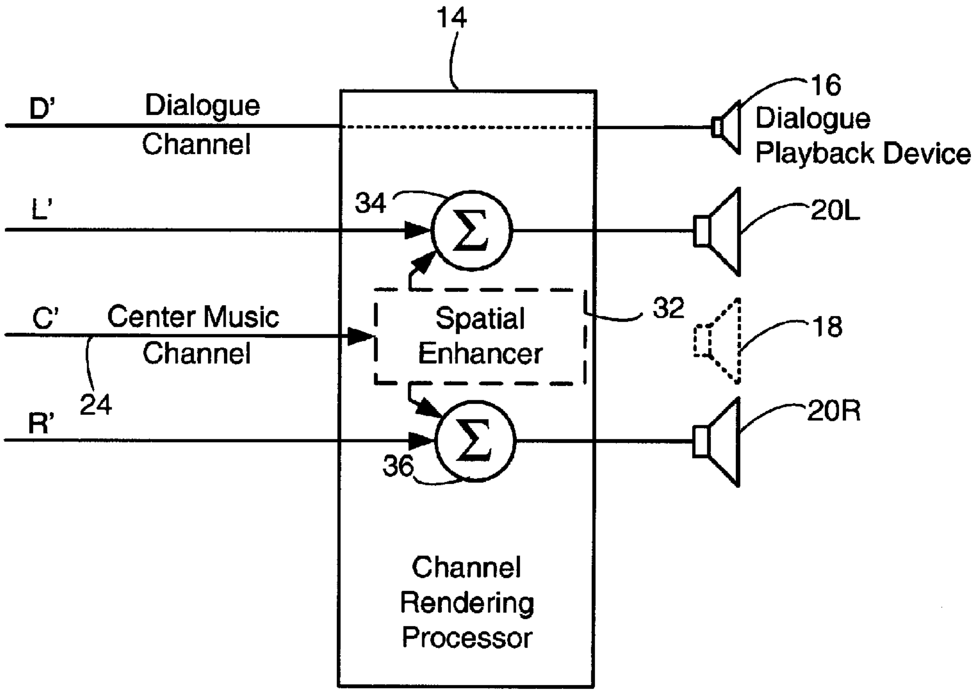
FIG. 5 is a block diagram of an audio system lacking a dedicated center channel playback device.

The audio system of FIG. 5 does not have the center music channel playback device 18 of previous figures. The audio system of FIG. 5 may have the input channels and the channel extraction processor of any of the previous figures, and they are omitted from this view. The audio system of FIG. 5 may also include left surround and right surround channels, also not shown in this view. The channel rendering processor 14 of FIG. 5 may include a spatial enhancer 32 coupled to the center music channel 24. The center music channel signal is summed with the left channel at summer 34 and with the right channel at summer 36 (through optional spatial enhancer 32 if present) so that the center channel is radiated through the left channel acoustic driver 20L and the right channel acoustic driver 20R. The channel rendering processor 14 renders the center channel through rendering circuitry more suited to music than to dialogue and radiates the center channel through an acoustic driver more suited to music than dialogue, without requiring separate center channel rendering circuitry and a separate center music channel acoustic driver.

The spatial enhancer 32, and the summers 34 and 36 are typically implemented in DSPs executing signal processing operations on digitally encoded audio signals.

The acoustic image can be enhanced by employing directional speakers, such as directional arrays. Directional speakers are speakers that have a radiation pattern in which more acoustic energy is radiated in some directions than in others. The directions in which relatively more acoustic energy is radiated, for example directions in which the sound pressure level is within 6 dB of (preferably between −6 dB and −4 dB, and ideally between −4 dB and −0 dB) the maximum sound pressure level (SPL) in any direction at points of equivalent distance from the directional speaker will be referred to as "high radiation directions." The directions in which less acoustic energy is radiated, for example directions in which the SPL is a level at least 4 dB (preferably between −6 dB and −12 dB, and ideally at a level down by more than 12 dB, for example −20 dB) with respect to the maximum in any direction for points equidistant from the directional speaker, will be referred to as "low radiation directions".

Figure 6:
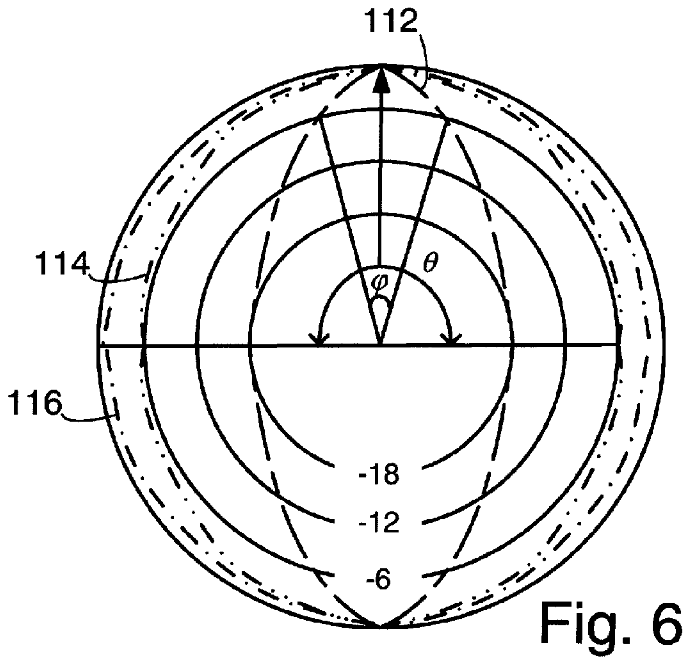
FIG. 6 is a polar plot of acoustic radiation patterns.

Directional characteristics of speakers are typically displayed as polar plots, such as the polar plots of FIG. 6. The radiation pattern of the speaker is plotted in a group of concentric rings. The outermost ring represents the maximum sound pressure level in any direction. The next outermost ring represents some level of reduced sound pressure level, for example −6 dB. The next outermost ring represents a more reduced sound pressure level, for example −12 dB, and so on. One way of expressing the directionality of a speaker is the internal angle between the −6 dB points on either side of the direction of maximum sound pressure level in any direction. For example, in FIG. 6, radiation pattern 112 has an internal angle of $\phi$ which is less than the internal angle $\theta$ of radiation pattern 114. Therefore radiation pattern 112 is said to be more directional than radiation pattern 114. Radiation patterns such as pattern 114 in which the internal angle approaches 180 degrees may be described as "non-directional". Radiation patterns such as pattern 116, in which the radiation in all directions is within −6 dB of the maximum in any direction may be described as "omnidirectional". Directional characteristics may also be classified as more directional by the difference in maximum and minimum sound pressure levels. For example, in radiation pattern 112 the difference between the maximum and minimum sound pressure levels is −18 dB, which would be characterized as more directional than radiation pattern 114, in which the difference between maximum and minimum sound pressure levels is −6 dB, which would be characterized as more directional than radiation pattern 116, in which the difference between the maximum and minimum sound pressure levels is less than −6 dB.

Radiating a dialogue channel from a directional speaker directly toward the listener causes the acoustic image to be tight and the apparent source of the sound to be unambiguously in the vicinity of the speaker. Radiating a music channel from a directional speaker but not directly at the listener, so that the amplitude of the reflected radiation is similar to or even higher than the amplitude of the direct radiation, can cause the acoustic image to be more diffuse, as does radiating a center music channel with less directionality or from a non-directional speaker.

One simple way of achieving directionality is through the dimensions of the speakers. Speakers tend to become directional at wavelengths that are near to and shorter than the diameter of the radiating surface of the speaker. However, this may be impractical, since radiating a dialogue channel directionally could require speakers with large radiating surfaces to achieve directionality in the speech band.

Another way of achieving directionality is through the mechanical configuration of the speaker, for example by using acoustic lenses, baffles, or horns.

A more effective and versatile way of achieving directionality is through the use of directional arrays. Directional arrays are directional speakers that have multiple acoustic energy sources. Directional arrays are discussed in more detail in U.S. Pat. No. 5,870,484, incorporated by reference herein in its entirety. In a directional array, over a range of frequencies in which the corresponding wavelengths are large relative to the spacing of the energy sources, the pressure waves radiated by the acoustic energy sources destructively interfere, so that the array radiates more or less energy in different directions depending on the degree of destructive interference that occurs. Directional arrays are advantageous because the degree of directionality can be controlled electronically and because a single directional array can radiate two or more channels and the two or more channels can be radiated with different degrees of directionality. Furthermore, an acoustic driver can be a component of more than one array.

In some of the figures, directional speakers are shown diagrammatically as having two cone-type acoustic drivers. The directional speakers may be some type of directional speaker other than a multi-element speaker. The acoustic drivers may be of a type other than cone types, for example dome types or flat panel types. Directional arrays have at least two acoustic energy sources, and may have more than two.

Increasing the number of acoustic energy sources increases the control over the radiation pattern of the directional speaker, for example by permitting control over the radiation pattern in more than one plane. The directional speakers in the figures show the location of the speaker, but do not necessarily show the number of, or the orientation of, the acoustic energy sources.

FIGS. 7-10 describe embodiments of the audio system of some of the previous figures with a playback system including directional speakers. FIGS. 7-10 show spatial relationship of the speakers to a listener 38 and also indicate which channels are radiated by which speakers and the degree of directionality with which the channels are radiated. A radiation pattern that is more directional than other radiation patterns in the same figure will be indicated by one arrow pointing in the direction of maximum radiation that is much longer and thicker than other arrows. A less directional pattern will be indicated by an arrow pointing in the direction of maximum radiation that is longer and thicker than other arrows by a smaller amount. FIGS. 7-10 may include other channels, such as surround channels, but the surround channels may not be shown. The details of the channel extraction processor 12 and the channel rendering processor 14 are not shown in these views, nor are the input channels.

The radiation pattern of directional arrays can be controlled by varying the magnitude and phase of the signal fed to each array element. In addition, the magnitude and phase of each element may be independently controlled at each frequency. The radiation pattern may also be controlled by the characteristics of the transducers and varying array geometry.

Figure 7:
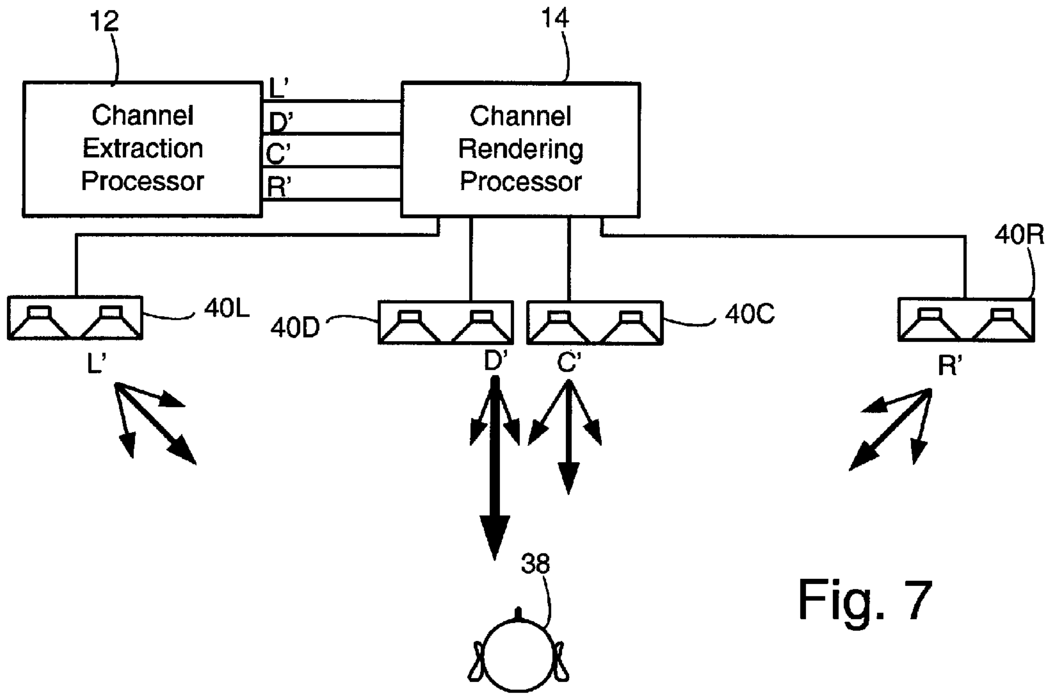
FIGS. 7-10 are diagrammatic views of channel extraction processors, channel rendering processors, and playback devices.

The audio system of FIG. 7 includes directional arrays 40L, 40R, 40C, and 40D coupled to the channel rendering processor 14.

The audio system of FIG. 7 is suited for use with the audio system of any of FIGS. 1-4, which produce a dialogue channel D', a center music channel C', and left and right channels L' and R', respectively. Dialogue channel D' is radiated with a highly directional radiation pattern from a directional array 40D approximately directly in front of the listener 38. Center music channel C' is radiated by a directional array 40C that is approximately directly in front of the speaker, with a radiation pattern that is less directional than the radiation pattern of directional array 40D. Left channel L' and right channel R' are radiated by directional arrays to the left and to the right, respectively, of the listener 38 with a radiation pattern that is approximately as directional as the radiation pattern of directional array 40C.

Figure 8:
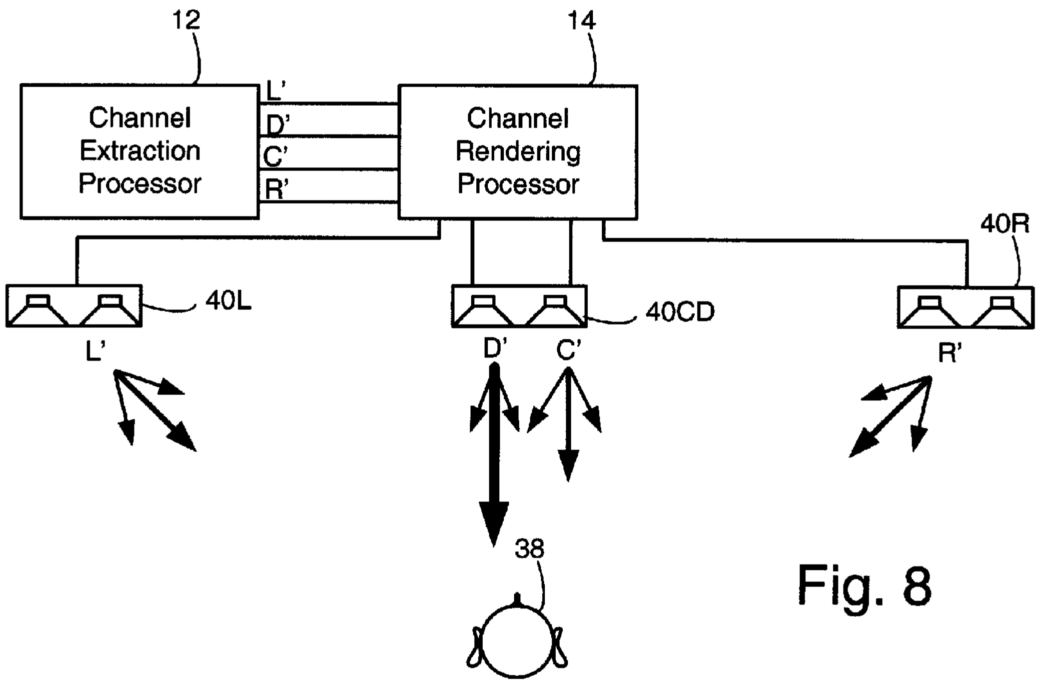

The audio system of FIG. 8 includes directional arrays 40L, 40R, and 40CD, coupled to the channel rendering processor 14. The audio system of FIG. 8 is also suited for use with the audio system of one of FIGS. 1-4. The audio system of FIG. 8 operates similarly to audio system of FIG. 7, but both dialogue channel D' and center music channel C' are radiated with different degrees of directionality.

Figure 9:
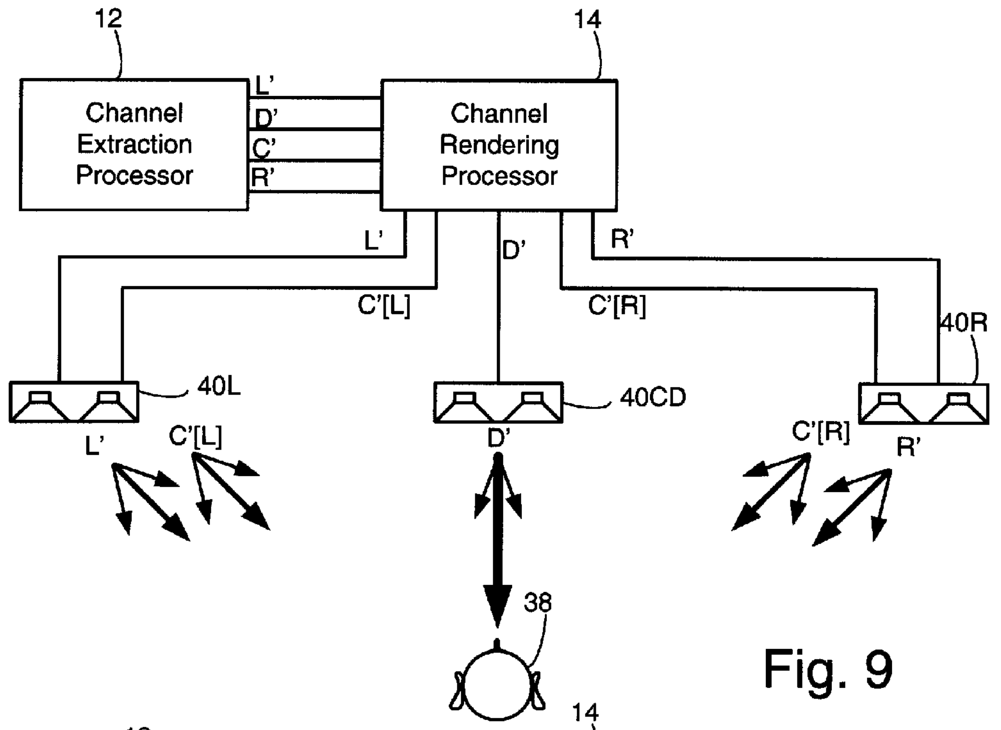

The audio system of FIG. 9 includes the channel rendering processor of FIG. 5. Left directional array 40L, right directional array 40R, and dialogue directional array 40D are coupled to the channel rendering processor 14. The left channel L' and the center channel left portion C'[L] are radiated by left directional array 40L. The right channel R' and center channel right portion C'[R] (which may be the same or different than center channel left portion) are radiated by right directional array 40R. The dialogue channel D' is radiated by dialogue directional array 40D with a higher degree of directionality than are the other channels radiated from directional arrays 40L and 40R.

Figure 10:
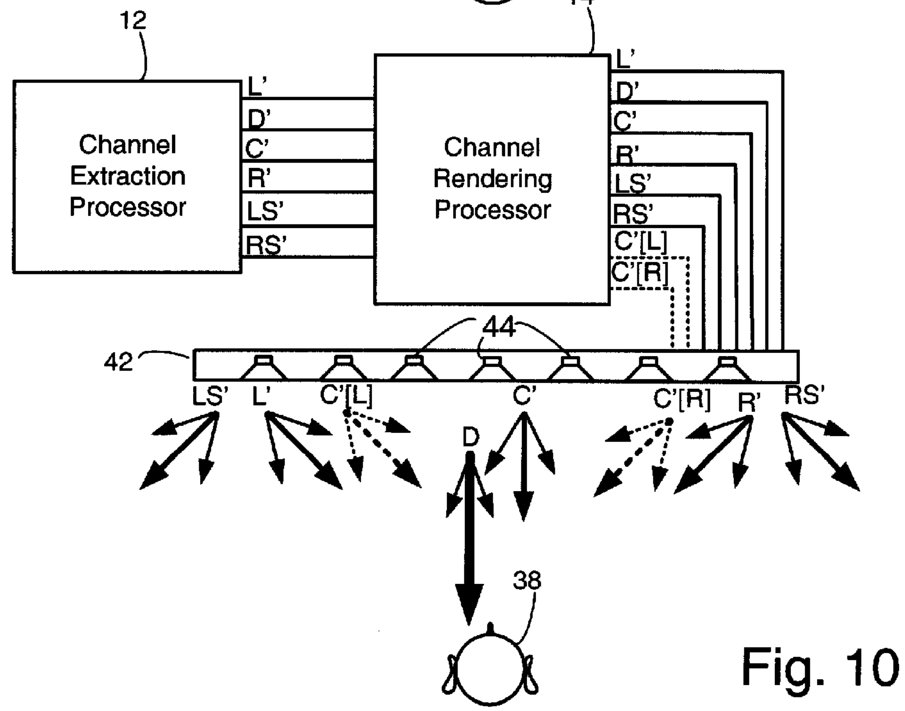

In the audio system of FIG. 10 the channel rendering processor 14 is coupled to an array 42 including a number, in this example 7, of acoustic drivers. The audio signals in channels L', R', C', D', LS', and RS' (and C'[L] and C'[R]) if present are radiated by directional arrays including subgroups of the acoustic drivers with different degrees of directionality. In one implementation, the center music channel and the dialogue channel are radiated by the three central acoustic drivers 44 and additionally by a tweeter that is not a part of the directional array.

Figure 11A:
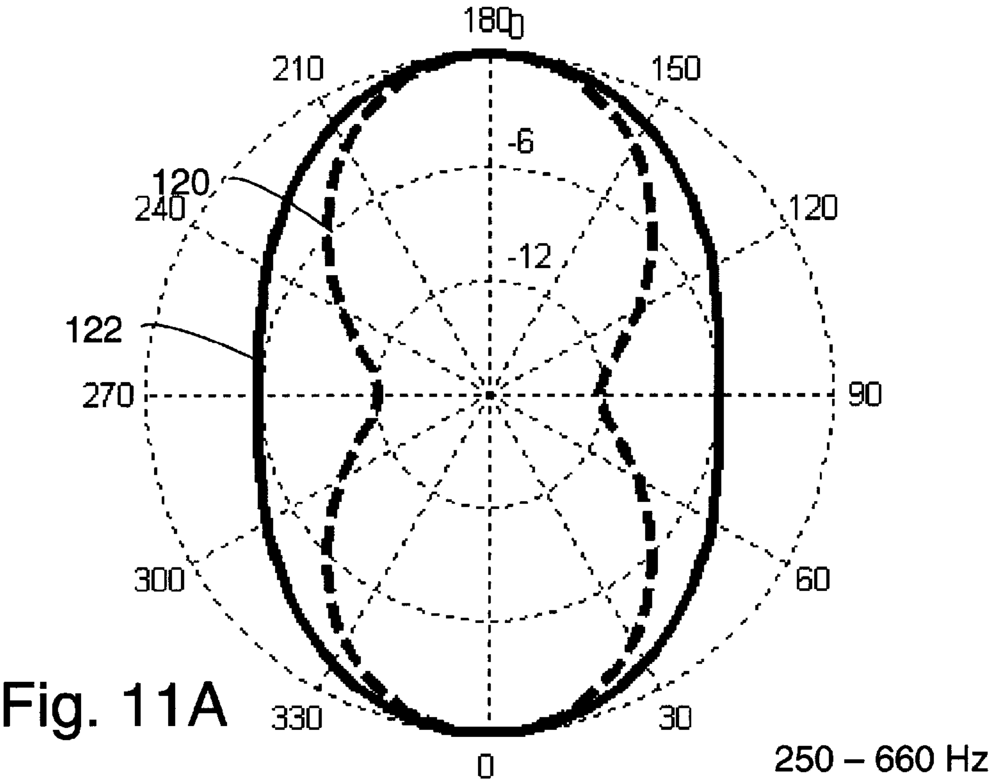
FIGS. 11A-11D are polar plots of radiation patterns of dialogue channels and center music channels.

For example, in FIG. 11A, in the frequency band of 250 Hz to 660 Hz, the internal angle of high radiation directions (within −6 dB of the maximum radiation in any direction) for the dialogue channel radiation pattern 120 is about 90 degrees, while the internal angle of high radiation directions for the music center channel radiation pattern 122 is about 180 degrees. The difference between the maximum and minimum sound pressure levels in any direction is −12 dB for dialogue channel 120. The difference between maximum sound pressure levels in any direction is −6 dB for music center channel 122. The dialogue channel radiation pattern 120 is therefore more directional than the radiation pattern 122 for the music center channel in this frequency range.

Figure 11B:
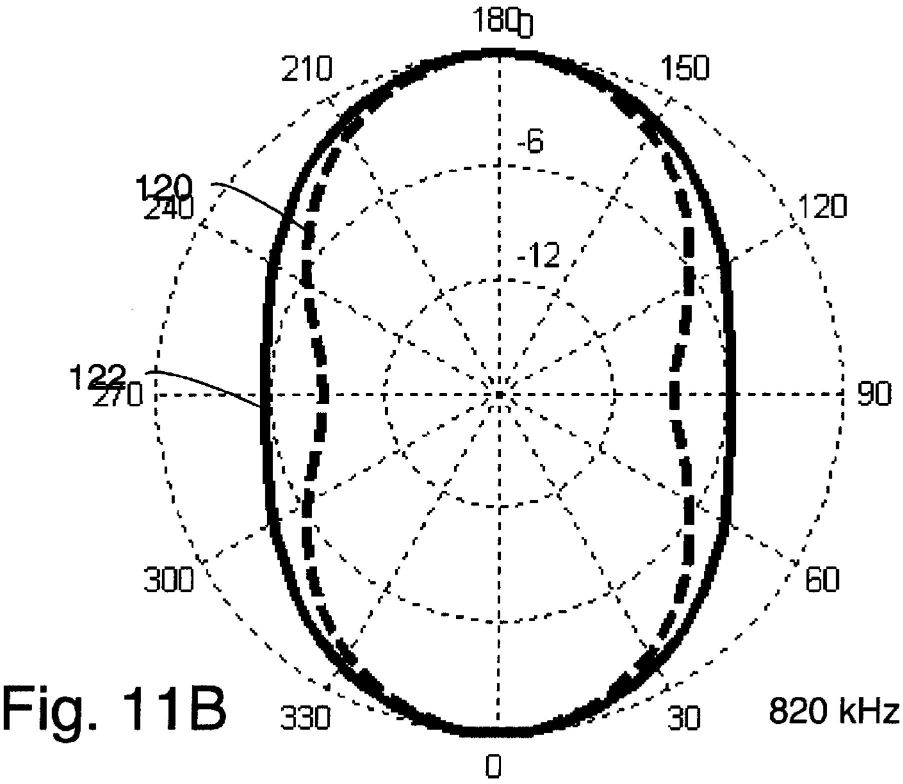

In FIG. 11B, for the 820 Hz third octave, the internal angle of high radiation directions is about 120 degrees for dialogue channel radiation pattern 120, while the internal angle for high radiation directions is about 180 degrees for music center channel radiation pattern 122. The difference between maximum and minimum sound pressure levels in any direction for the dialogue channel radiation pattern 120 is about −9 dB, while the difference between maximum and minimum sound pressure level for music center channel radiation pattern 122 is about −6 dB. The dialogue channel radiation pattern 120 is therefore more directional than the radiation pattern 122 for the music center channel in this frequency range also.

Figure 11C:
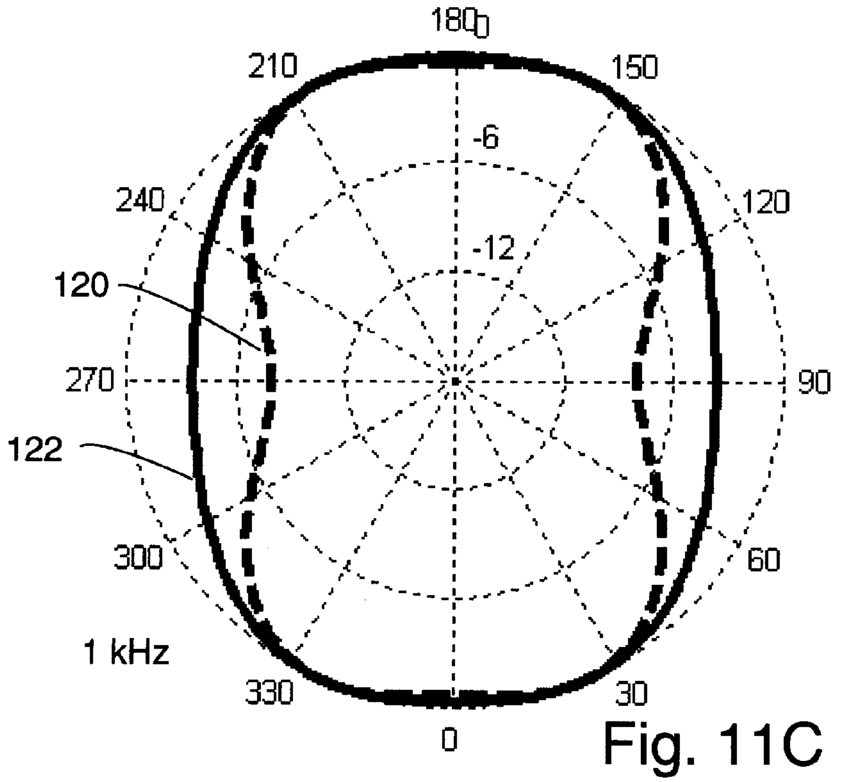

In FIG. 11C, for the 1 kHz third octave, the internal angle for high radiation directions is about 130 degrees for the dialogue channel radiation pattern 120 and the radiation pattern 122 for the music center channel is substantially omnidirectional, so the dialogue channel radiation pattern 120 is more directional than the radiation pattern 122 for the music center channel.

Figure 11D:
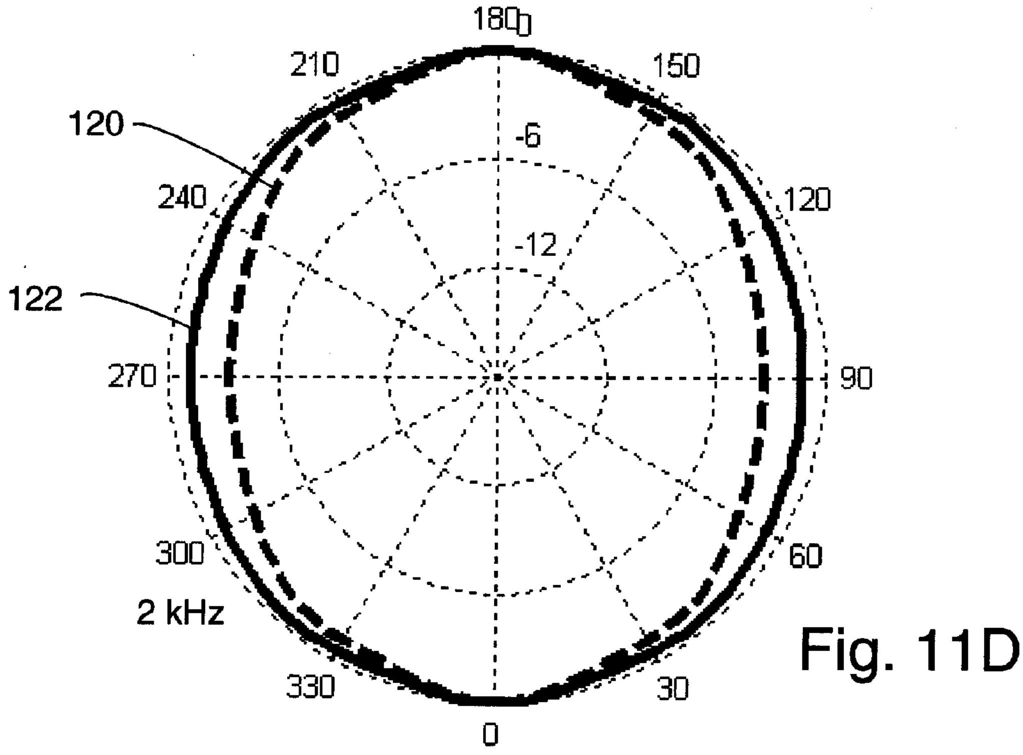

In FIG. 11D, for the 2 kHz third octave, the radiation pattern for both the dialogue channel radiation pattern 120 and the music center channel are both substantially omnidirectional. The difference between the maximum and minimum sound pressure level for the dialogue channel radiation pattern 120 is about −3 dB and for the music center channel radiation pattern about −1 dB, so the dialogue channel radiation pattern is slightly more directional than the music center channel radiation pattern.

Since the radiation pattern for the dialogue channel radiation pattern 120 is more directional than the radiation pattern 122 for the music center channel in all frequency ranges shown in FIGS. 11A, 11B, 11C, and 11D, it is more directional than the radiation pattern 122 for the music center channel.

Those skilled in the art may now make numerous uses of and departures from the specific apparatus and techniques disclosed herein without departing from the inventive concepts. Consequently, the invention is to be construed as embracing each and every novel feature and novel combination of features disclosed herein and limited only by the spirit and scope of the appended claims.

What is claimed is:

1. A multichannel audio system comprising:

a rendering processor for separately rendering a center dialogue channel and a center music channel; and a channel extractor for extracting at least one of the center dialogue channel and the center music channel from program material that does not include both of the dialogue channel and the center music channel;

wherein the rendering processor is coupled to an array of acoustic drivers.

2. An audio system according to claim 1, wherein the channel extractor comprises circuitry for extracting a dialogue channel and a center music channel from program material that does not include either of a dialogue channel and a center music channel.

3. An audio system according to claim 1, the rendering processor further comprising circuitry for processing the dialogue channel audio signal and the center music channel audio signal so that the center dialogue channel and the center music channel are radiated with different radiation patterns by a directional array.

4. An audio system according to claim 3, wherein the dialogue channel and the center music channel are radiated by the same directional array.

5. An audio system according to claim 3, wherein the dialogue channel and the center music channel are radiated by different elements of the same directional array.

6. An audio system according to claim 4, wherein the internal angle of directions with sound pressure levels within −6 dB of the highest sound pressure level in any direction is less than 120 degrees in a frequency range for the dialogue channel radiation pattern, and wherein the internal angle of directions with sound pressure levels within −6 dB of the highest sound pressure level in any direction is greater than 120 degrees in at least a portion of the frequency range for the center music channel radiation pattern.

7. An audio system according to claim 3, wherein the difference between the maximum sound pressure level in any direction in a frequency range and the minimum sound pressure level in any direction in the frequency range is greater than −6 dB for the dialogue channel radiation pattern and between 0 dB and −6 dB for the center music channel radiation pattern.

8. An audio system according to claim 1, wherein the rendering processor renders the dialogue channel and the center music channel to different speakers.

9. An audio system according to claim 1, wherein the rendering processor combines the center music channel with a left channel or a right channel or both.

10. An audio system according to claim 1 wherein the array comprises subgroups of the acoustic drivers comprising different degrees of directionality.

11. A multichannel audio signal processing system comprising a discrete center channel input;

a left input channel;

a right input channel; and signal processing circuitry to process the discrete center channel input and the left and right input channels to create a center music channel.

12. An audio signal processing system according to claim 11, wherein the signal processing circuitry comprises circuitry to process channels other than the discrete center channel to create the center music channel.

13. An audio signal processing system according to claim 11, wherein the signal processing circuitry comprises circuitry to process the discrete center channel and other audio channels to create the center music channel.

14. An audio signal processing system according to claim 11, further comprising circuitry to provide the discrete center channel to a first speaker and the center music channel to a second speaker.

15. A multichannel audio processing system comprising:

a channel extractor for extracting at least one of a dialogue channel and a center music channel from program material that does not include both of the dialogue channel and the center music channel.

16. An audio processing system according to claim 15, wherein the channel extractor comprises circuitry for extracting the dialogue channel and the center music channel from program material that does not include either of the dialogue channel and the center music channel.

* * * * *